United States Patent
Qiu et al.

(10) Patent No.: US 10,553,458 B2
(45) Date of Patent: Feb. 4, 2020

(54) CHIP PACKAGING METHOD

(71) Applicant: SJ SEMICONDUCTOR (JIANGYIN) CORPORATION, Jiangyin (CN)

(72) Inventors: Yuedong Qiu, Jiangyin (CN); Chengchung Lin, Jiangyin (CN)

(73) Assignee: SJ SEMICONDUCTOR (JIANGYIN) CORPORATION, JiangYin (CN)

( * ) Notice: Subject to any disclaimer, the term of this patent is extended or adjusted under 35 U.S.C. 154(b) by 0 days.

(21) Appl. No.: 15/751,790

(22) PCT Filed: May 20, 2016

(86) PCT No.: PCT/CN2016/082779
§ 371 (c)(1),
(2) Date: Jun. 13, 2018

(87) PCT Pub. No.: WO2017/041519
PCT Pub. Date: Mar. 16, 2017

(65) Prior Publication Data
US 2019/0035642 A1     Jan. 31, 2019

(30) Foreign Application Priority Data
Sep. 10, 2015 (CN) .......................... 2015 1 0575637

(51) Int. Cl.
*H01L 21/00* (2006.01)
*H01L 21/56* (2006.01)
*H01L 23/00* (2006.01)

(52) U.S. Cl.
CPC ............ *H01L 21/568* (2013.01); *H01L 24/04* (2013.01); *H01L 24/13* (2013.01); *H01L 24/96* (2013.01);
(Continued)

(58) Field of Classification Search
CPC ..... H01L 21/561; H01L 21/568; H01L 24/04; H01L 24/13; H01L 24/19; H01L 24/96; H01L 24/97
See application file for complete search history.

(56) References Cited

U.S. PATENT DOCUMENTS 8,828,802 B1 * 9/2014 Park ........................ H01L 24/20
257/698
2015/0021764 A1 * 1/2015 Paek ................. H01L 23/49838
257/737

FOREIGN PATENT DOCUMENTS

CN 103187376 A 7/2013
CN 103383923 A 11/2013
(Continued)

OTHER PUBLICATIONS

PCT International Search Report for application PCT/CN2016/082779 dated Jul. 27, 2016.

*Primary Examiner* — Richard A Booth
(74) *Attorney, Agent, or Firm* — Alston & Bird LLP

(57) ABSTRACT

The method of chip packaging comprises: S1: providing a carrier, and forming an adhesive layer on a surface of the carrier; S2: forming a first dielectric layer on a surface of the adhesive layer, and forming a plurality of first through holes corresponding to electrical leads of a semiconductor chip in the dielectric layer; S3: attaching the semiconductor chip with the front surface facing downwards to the surface of the first dielectric layer; S4: forming a plastic encapsulation layer covering the chip on the surface of the first dielectric layer; S5: separating the adhesive layer and the first dielectric layer to remove the carrier and the adhesive layer; and S6: forming a redistribution layer for the semiconductor chip based on the first dielectric layer and the first through holes.

12 Claims, 3 Drawing Sheets

(52) U.S. Cl.
CPC ...... *H01L 21/561* (2013.01); *H01L 2224/024* (2013.01); *H01L 2224/0231* (2013.01); *H01L 2224/0236* (2013.01); *H01L 2224/02379* (2013.01); *H01L 2224/0401* (2013.01); *H01L 2224/13024* (2013.01)

(56) References Cited

FOREIGN PATENT DOCUMENTS

| | | | |
|---|---|---|---|
| CN | 105070671 A | 11/2015 | |
| CN | 105206539 A | 12/2015 | |
| WO | WO 2017-041519 A1 | 3/2017 | |

\* cited by examiner

CHIP PACKAGING METHOD

CROSS REFERENCES TO RELATED APPLICATIONS

This application claims the benefit of priority to Chinese Patent Application No. CN2015105756378, entitled "Chip Packaging Method", filed with the Chinese Patent Office on Sep. 10, 2015, and the PCT Application PCT/CN2016/082779, filed on May 20, 2016, the contents of which are incorporated herein by reference in its entirety.

TECHNICAL FIELD

The present application relates to the field of semiconductor manufacturing and more specifically, relates to a chip packaging method.

BACKGROUND

The traditional fan-out wafer level packaging (FOWLP) generally includes the following steps: first, cutting a single microchip from a wafer, and using a standard pick-and-place device to paste the chip with the front surface facing downwards onto an adhesive layer of a carrier; then forming a plastic encapsulation layer, and embedding the chip into the plastic encapsulation layer; removing the carrier and the adhesive layer after the plastic encapsulation layer is cured, then performing a redistribution layer process and a ball placement reflow process, and finally performing cutting and testing.

A redistribution layer (RDL) is an interface surface between a chip and a package in a flip-chip assembly. The redistribution layer is an extra metal layer that consists of core metal top traces and is used to bind I/O pads of a die outward to other locations such as bump pads. Bumps are usually arranged in a grid pattern with two pads cast on each bump (one on the top and one on the bottom), and the two pads are respectively connected to the redistribution layer and the package substrate.

In the existing fan-out chip packaging technology, the adhesive layer is usually separated from the chip during the process of removing the adhesive layer. However, a part of the adhesive residue may remain inevitably on the chip and the chip is thus contaminated.

There are currently some ways to overcome this drawback. One existing solution is as follows: a redistribution layer is directly formed on a Si supporting wafer, and solder bumps are fabricated on the surface of a semiconductor chip; then the semiconductor chip is adhered to the Si supporting wafer on which the redistribution layer is formed, followed by the formation of a plastic encapsulation layer and the thinning and removal of the Si substrate. This method can effectively prevent the chip contamination problem caused by residue of the adhesive layer. However, since it needs to process the bumps on the surface of the chip prior to chip bonding, and it is difficult to thin and remove the Si substrate, the process complexity is increased. Another existing solution is to form a dielectric layer on the surface of the adhesive layer. This method can overcome the chip contamination problem caused by residue of the adhesive glue and simplify the process steps, but the subsequent formation of through-holes in the dielectric layer is very difficult to achieve.

Therefore, how to provide a chip packaging method to overcome the chip contamination problem caused by the adhesive layer and to simplify the process steps to achieve a good packaging effect has become an important technical problem to be solved urgently by those skilled in the art.

SUMMARY

In view of the above disadvantages of the currently techniques, an object of the present application is to provide a chip packaging method for solving the current problem, the adhesive layer residue in the semiconductor chip packaging process, which results in chip contamination and lowering the product yield.

To achieve the above object and other related objects, the present application provides a chip packaging method, comprising the following steps:

S1: providing a carrier, and forming an adhesive layer on a surface of the carrier;

S2: forming a first dielectric layer on the surface of the adhesive layer, and forming a plurality of first through holes corresponding to electrical leads of a semiconductor chip in the first dielectric layer;

S3: attaching the semiconductor chip with the front surface facing downwards onto the surface of the first dielectric layer;

S4: forming a plastic encapsulation layer covering the chip on the surface of the first dielectric layer;

S5: separating the adhesive layer and the first dielectric layer to remove the carrier and the adhesive layer;

S6: forming a redistribution layer for the semiconductor chip based on the first dielectric layer and the first through holes.

Optionally, the method further includes step S7 of forming a lower-bump metal layer on a surface of the redistribution layer and forming solder ball bumps on a surface of the lower-bump metal layer.

Optionally, step S7 comprises:

S7-1: forming a second dielectric layer covering the redistribution layer on the surface of the first dielectric layer, and forming a plurality of second through holes in the second dielectric layer;

S7-2: forming the under-bump metal layer and the solder ball bumps based on the second dielectric layer and the second through holes.

Optionally, the material of the carrier is selected from at least one of a metal, a semiconductor, a polymer and glass.

Optionally, the material of the adhesive layer is selected from an adhesive tape and an adhesive fabricated by a spin coating process.

Optionally, the method for separating the adhesive layer and the first dielectric layer is selected from at least one of chemical etching, mechanical peeling, mechanical grinding, thermal baking, ultraviolet irradiation, laser ablation, chemical mechanical polishing, and wet stripping.

Optionally, the first dielectric layer is selected from any one of photosensitive polyimide, photosensitive benzocyclobutene and photosensitive polybenzoxazole.

Optionally, in step S2, the first through holes are formed in the first dielectric layer by using the first dielectric layer as a photoresist layer through exposure and development.

Optionally, in step S4, the plastic encapsulation layer is made of a thermosetting material; and the method for forming the plastic encapsulation layer is selected from any one of compressive molding, printing, transfer molding, liquid sealing molding, vacuum lamination and spin coating.

Optionally, in step S6, the method for forming the redistribution layer includes at least one of a physical vapor deposition method, a chemical vapor deposition method, electroplating, and chemical plating; the redistribution layer is a single layer or multiple layers, and the material thereof is selected from at least one of aluminum, copper, tin, nickel, gold and silver.

As described above, the chip packaging method of the present application has the following beneficial effects: through manufacturing the first dielectric layer between the adhesive layer and the semiconductor chip and forming several first through holes corresponding to the electrical leads of the semiconductor chip in the first dielectric layer, the chip packaging method of the present application not only avoids the problem that the semiconductor chip is contaminated due to the adhesive layer being directly adhered to the semiconductor chip, but also solves the problem that it is difficult to form the through holes in the first dielectric layer after the chip is adhered. The first dielectric layer can be made of a photosensitive material. The first dielectric layer is used as a photoresist layer and a dielectric material at the same time, and the first through holes can be directly obtained in the first dielectric layer by photoetching, development and other steps, and the process is simpler. By the chip packaging method of the present application, the contamination of the semiconductor chip during the packaging process is well controlled, and the process steps of the present application are simple, which can effectively improve the product yield and the electrical performance.

DESCRIPTIONS OF COMPONENTS REFERENCE NUMERALS

Figure 1:
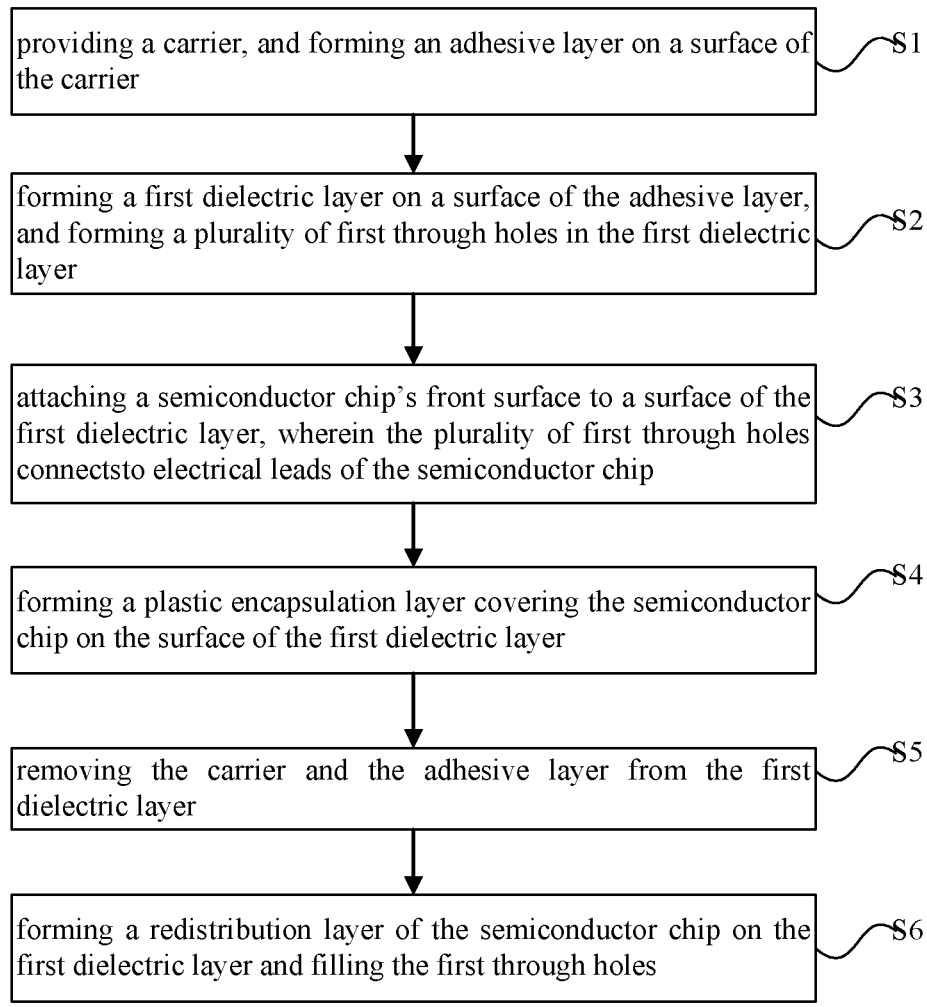
FIG. 1 illustrates a process flow chart of a chip packaging method according to the present disclosure.

S1-S6 Steps 1-6
1 Carrier
2 Adhesive layer
3 First dielectric layer
4 First through hole
5 Semiconductor chip
6 Plastic encapsulation layer
7 Redistribution layer
8 Under-bump metal layer
9 Solder ball bumps
10 Second dielectric layer
11 Second though holes

DETAILED DESCRIPTION OF THE PREFERRED EMBODIMENTS

Embodiments of the present disclosure are described by using specific embodiments. Those skilled in the art could easily understand other advantages and effects of the present disclosure from the contents disclosed in this specification. The present disclosure may also be implemented or applied through other different specific embodiments. Details in this specification may also be variously modified or changed based on different perspectives and applications without departing from the spirit of the present disclosure.

Please referring to FIG. 1 to FIG. 10. It should be noted that, the illustrations provided in this embodiment merely illustrate the basic idea of the present disclosure in a schematic manner. Therefore, only components related in the present disclosure are shown in the drawings, instead of showing the components in the number, the shapes and the dimensions upon actual implementation; the configurations, the number, and the proportion of the components upon actual implementation can be randomly changed; and the configuration of the component layout may also be more complicated.

The present disclosure provides a chip packaging method. Please refer to FIG. 1 which illustrates a process flowchart of the method. The method comprises the following steps:

S1: providing a carrier, and forming an adhesive layer on a surface of the carrier;

S2: forming a first dielectric layer on the surface of the adhesive layer, and forming several first through holes corresponding to electrical leads of a semiconductor chip in the first dielectric layer;

S3: attaching the semiconductor chip with the front surface facing downwards onto the surface of the first dielectric layer;

S4: forming a plastic encapsulation layer covering the chip on the surface of the first dielectric layer;

S5: separating the adhesive layer and the first dielectric layer to remove the carrier and the adhesive layer;

S6: forming a redistribution layer for the semiconductor chip based on the first dielectric layer and the first through holes.

Figure 2:
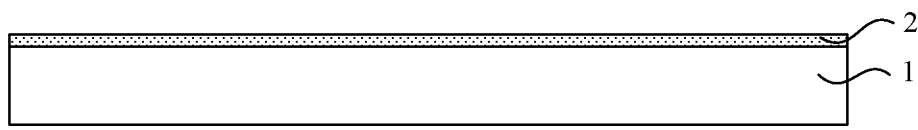
FIG. 2 illustrates a schematic diagram of forming an adhesive layer on a surface of a carrier according to a chip packaging method according to the present disclosure.

Referring first to FIG. 2, step S1 is performed: providing a carrier 1 and forming an adhesive layer 2 on the surface of the carrier 1.

Specifically, the carrier 1 may provide rigidity structure or a base for subsequently manufactured adhesive layer 2 and first dielectric layer 3. A material of the carrier 1 may be selected from at least one of a metal, a semiconductor (e.g., Si), a polymer or glass. As an example, the material of the carrier 1 is glass.

In the subsequent process, the adhesive layer 2 serves as a separating layer between the first dielectric layer 3 and the carrier 1, which is most preferably made of an adhesive material having a smooth and clean surface, and is capable of manufacturing the first dielectric layer 3 on its surface, it should have a certain bonding force with respect to the first dielectric layer 3 to ensure that the dielectric layer 3 does not automatically fall off in the subsequent process or the like, and additionally the adhesive layer 2 has a relatively strong bonding force with respect to the carrier 1. In general, the binding force of the adhesive layer 2 with respect to the carrier 1 needs to be greater than that with respect to the dielectric layer 3. As an example, the material of the adhesive layer 2 is selected from an adhesive tape and an adhesive prepared through a spin coating process. The adhesive tape is preferably an UV tape, which may be easily torn off after UV irradiation.

Figure 3:
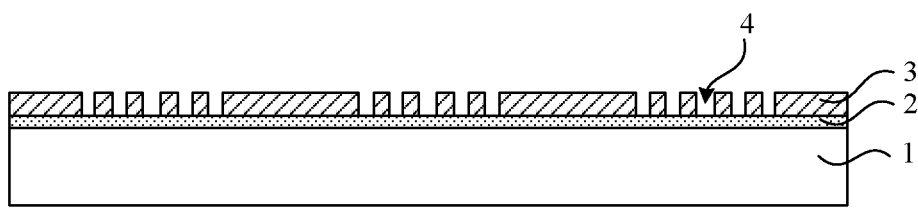
FIG. 3 illustrates a schematic diagram of forming a first dielectric layer on a surface of the adhesive layer and forming first through holes in the first dielectric layer according to the chip packaging method in the present disclosure.

Then referring to FIG. 3, step S2 is performed: forming the first dielectric layer 3 on the surface of the adhesive layer 2, and form a plurality of first through holes corresponding to electric leads of the semiconductor chip in the first dielectric layer 3.

Specifically, the first dielectric layer 3 can be formed by various deposition methods, such as coating. The material of the first dielectric layer 3 may be selected from any one of photosensitive polyimide, photosensitive benzocyclobutene and photosensitive polybenzoxazole. All of the photosensitive polyimide, photosensitive benzocyclobutene and photosensitive polybenzoxazole are low K dielectrics and are good dielectric materials suitable for integrated circuits.

Particularly, since the first dielectric layer can employ a photosensitive material, the first dielectric layer can serve as a photoresist layer while being a dielectric material, the first through holes 4 can be directly obtained in the first dielectric layer through steps of exposure, development and the like, which greatly may simplify the manufacturing process of an IC and save costs.

As an example, the first dielectric layer 3 preferably employs photosensitive polyimide. Polyimide is an organic polymer material containing imine groups and having good thermal stability, chemical stability, electrical insulation and excellent mechanical strength, and is the main polymer for an insulation layer, an α-particle barrier and circuit packages of a new generation of integrated circuit multilayer wiring and a multi-chip component. But standard polyimide does not have the photosensitive function. In the present disclosure, the photosensitive polyimide itself plays a photolithographic role and also is a dielectric material, and can be directly exposed and developed without cooperation with a photoresist to make into a circuit diagram. In this embodiment, the photosensitive polyimide may be either positive photosensitive polyimide or negative photosensitive polyimide.

After the first through holes 4 are formed, a subsequent cleaning process may be further performed to remove impurities in the first through holes 4.

Figure 4:
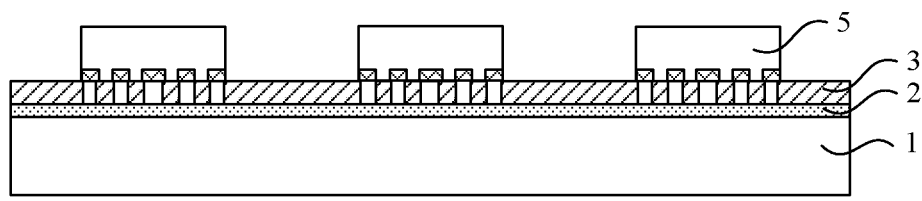
FIG. 4 illustrates a schematic diagram of attaching a semiconductor chip with the front surface facing downwards onto the surface of the first dielectric layer according to the chip packaging method in the present disclosure.

Next, referring to FIG. 4, the step S3 is performed: attaching the semiconductor chip 5 with the front surface facing downwards onto the surface of the first dielectric layer 3.

Specifically, the semiconductor chip 5 includes, but is not limited to, a memory device, a display device, an input component, a discrete element, a power supply, a voltage regulator, and the like. The number of the semiconductor chips 5 may be one or more. In this embodiment, the number of the semiconductor chips 5 is the number of the semiconductor chips 5 that can be carried by one wafer. The electrical leads of each semiconductor chips 5 are respectively aligned with the corresponding first through holes 4.

Figure 5:
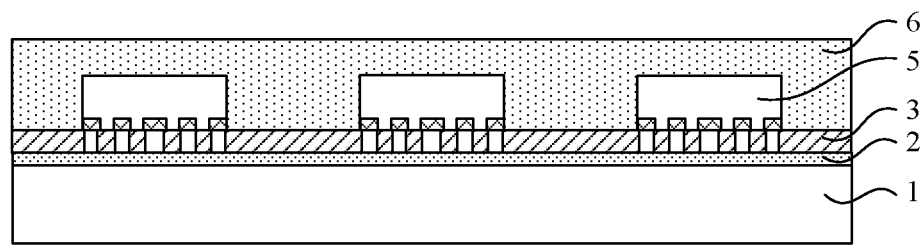
FIG. 5 illustrates a schematic diagram of forming a plastic encapsulation layer covering the chip on the surface of the first dielectric layer according to the chip packaging method in the present disclosure.

Then referring to FIG. 5, the step S4 is performed: forming a plastic encapsulation layer 6 covering the chip on the surface of the first dielectric layer 3.

Specifically, the plastic encapsulation layer 6 is made of a thermosetting material, for example, a common plastic encapsulation material such as silicone rubber or epoxy resin. The method for forming the plastic encapsulation layer 6 may be selected from, but not limited to, any of compressive molding, paste printing, transfer molding, liquid encapsulate molding, vacuum lamination, spin coating, and the like.

For example, transfer molding is one method of plastic molding which is a method of heating a closed metal mold, pressing a molten resin to be molded and hardened into the metal mold from a thin tube gate. As compared with optional compressive molding, transfer molding has a higher precision, and can produce molded products in very complex shapes. In addition, it is possible to obtain a plurality of molded products in a connected mold simultaneously by loading the resin at one place and one operation. This molding method is mainly used for molding thermosetting resins such as phenolic resin, urea resin, melamine, epoxy resin and polyester, and thus it is also called injection molding of thermosetting resin.

By forming the plastic encapsulation layer 6, the semiconductor chip 5 can be further fixed between the plastic encapsulation layer 6 and the first dielectric layer 3, so that its stability is greatly enhanced. Moreover, the plastic encapsulation layer 6 can protect the semiconductor chip 5 from external elements and contaminants.

Figure 6:
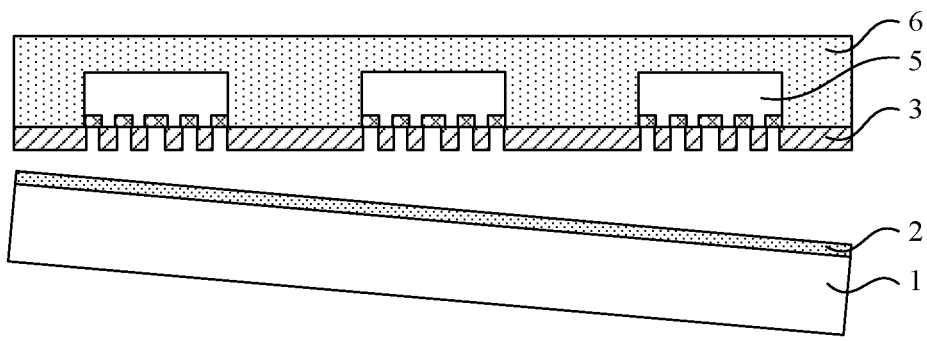
FIG. 6 illustrates a schematic diagram of removing the carrier and the adhesive layer according to the chip packaging method in the present disclosure.

Then referring to FIG. 6, the step S5 is performed: separating the adhesive layer 2 and the first dielectric layer 3 to remove the carrier 1 and the adhesive layer 2.

Specifically, the method for separating the adhesive layer 2 and the first dielectric layer 3 is selected from, but not limited to, at least one of chemical etching, mechanical peeling, mechanical grinding, thermal baking, ultraviolet irradiation, laser ablation, chemical mechanical polishing and wet stripping. For example, if the adhesive layer 2 employs a UV adhesive tape, the UV adhesive tape may be first reduced in viscosity by ultraviolet irradiation, and then the carrier 1 and the adhesive layer 2 are removed from the first dielectric layer by means of tearing off. Compared with a thinning process such as grinding and corrosion, this separation method is more simple and easy to operate and can greatly reduce the cost of the process.

Figure 7:
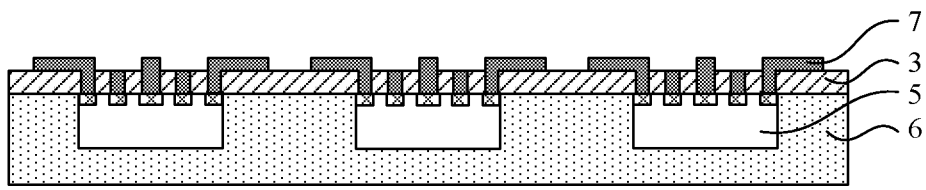
FIG. 7 illustrates a schematic diagram of forming the redistribution layer for the semiconductor chip based on the first dielectric layer and the first through holes according to the chip packaging method in the present disclosure.

Finally, referring to FIG. 7, the step S6 is performed: forming the redistribution layer 7 for the semiconductor chip 5 based on the first dielectric layer 3 and the first through holes 4.

Specifically, the method for forming the redistribution layer 7 is selected from but not limited to at least one of physical vapor deposition, chemical vapor deposition, electroplating and chemical plating. The redistribution layer 7 may be a single layer or multiple layers, and the material thereof is selected from, but not limited to, at least one of aluminum, copper, tin, nickel, gold and silver.

As shown in FIG. 7, the redistribution layer 7 includes a conductive pillar filled in the first through holes 4 and a metal line formed on the surface of the first dielectric layer 3. The conductive pillar and the metal line may be separately formed or may be formed together. As an example, a metal conductor is first filled in the first through holes 4 by deposition, electroplating or other process to form a conductive pillar; then a photoresist pattern is formed on the surface of the first dielectric layer 3, and depositing or sputtering a seed layer (e.g., a Ti/Cu seed layer) on the surface of the first dielectric layer 3 based on the photoresist pattern; then the metal line is formed by plating the metal conductor based on the seed layer; and finally the photoresist pattern is removed to obtain the redistribution layer 7.

Figure 8:
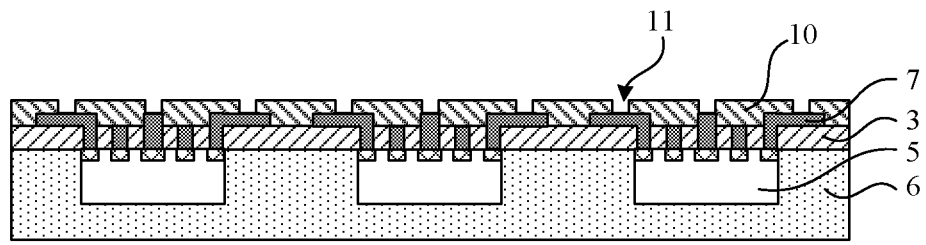
FIG. 8 illustrates a schematic diagram of forming a second dielectric layer covering the redistribution layer on the surface of the first dielectric layer and forming several second through holes in the second dielectric layer according to the chip packaging method in the present disclosure.
Figure 9:
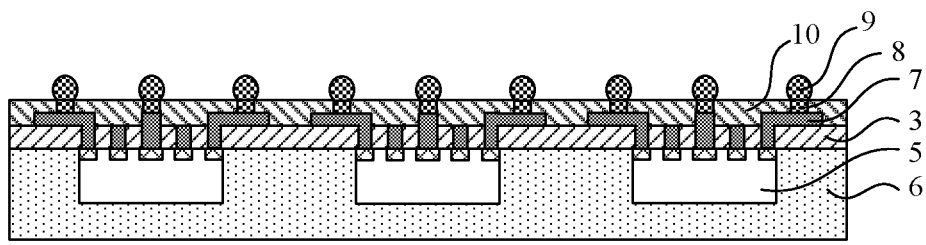
FIG. 9 illustrates a schematic diagram of forming an under-bump metal layer and solder ball bumps based on the second dielectric layer and the second through holes according to the chip packaging method in the present disclosure.

Further, the chip packaging method of the present disclosure further includes step S7: as shown in FIG. 8 and FIG. 9, forming an under-bump metal layer 8 on the surface of the redistribution layer 7, and forming solder ball bumps 9 on the surface of the under-bump metal layer 8.

Specifically, the step S7 comprises:

step S7-1: as shown in FIG. 8, forming a second dielectric layer 10 covering the redistribution layer 7 on the surface of the first dielectric layer 3, and forming a plurality of second through holes 11 in the second dielectric layer 10;

step S7-2: forming the under-bump metal layer 8 and the solder ball bumps 9 based on the second dielectric layer 10 and the second through holes 11.

The second dielectric layer 10 may be made of a different material from the first dielectric layer, such as silicon dioxide, silicon nitride or the like. The under-bump metal layer 8 can prevent diffusion between the solder ball bumps 9 and the integrated circuit, and achieve a lower contact resistance. In general, the under-bump metal layer 8 may be a single layer or multiple layers of metal. As an example, the under-bump metal layer 8 is a Ti/Cu composite layer. The material of the solder ball bump 9 includes, but is not limited to, conductive metals such as Ag or Cu.

Figure 10:
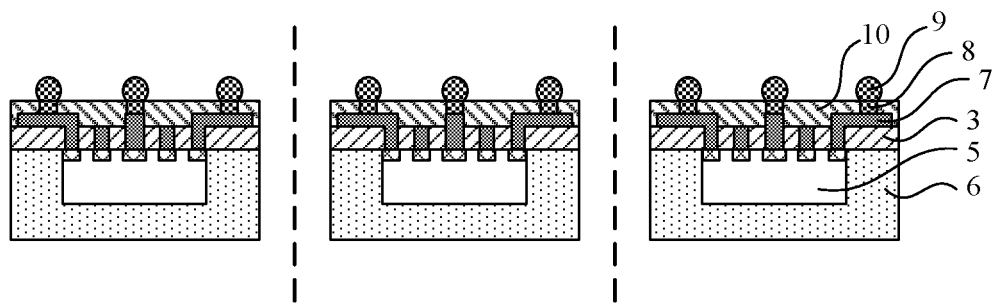
FIG. 10 illustrates a schematic diagram of cutting a discrete chip according to the chip packaging method in the present disclosure.

As shown in FIG. 10, the individual semiconductor chips can finally be separated by a dicing process.

To sum up, through manufacturing the first dielectric layer between the adhesive layer and the semiconductor chip and forming a plurality of first through holes corresponding to electrical leads of the semiconductor chip in the first dielectric layer, the chip packaging method of the present disclosure not only avoids the problem that the semiconductor chip is contaminated due to the adhesive layer being directly adhered to the semiconductor chip, but also solves the problem that it is difficult to form the through holes in the first dielectric layer after the chip is adhered. The first dielectric layer can be made of a photosensitive material, which may be used as a photoresist layer and dielectric material at the same time. The first through holes can be obtained in the first dielectric layer directly by photolithography, development or other steps, and the process is simpler. By the chip packaging method of the present disclosure, the contamination of the semiconductor chip during the packaging process is well controlled, and the process steps of the present disclosure are simple, which can effectively improve the product yield and the electrical performance. Therefore, the present disclosure effectively overcomes various disadvantages of the prior art and has a high industrial value.

The above-mentioned embodiments merely illustrate the principle of the present application and its efficacy, but are not intended to limit the present application. Any person skilled in the art may make modifications or changes to the above-mentioned embodiments without departing from the spirit and scope of the present application. Therefore, all equivalent modifications or changes made by those skilled in the art without departing from the spirit and technical idea disclosed in the present application should still be covered by the claims of the present application.

What is claimed is:

1. A chip packaging method, comprising the following steps:
    S1: providing a carrier, and forming an adhesive layer on a surface of the carrier;
    S2: forming a first dielectric layer on a surface of the adhesive layer, and forming a plurality of first through holes in the first dielectric layer, wherein the first dielectric layer is a photoresist layer;
    S3: attaching a semiconductor chip's front surface to a surface of the first dielectric layer, wherein the plurality of first through holes connects to electrical leads on the front surface of the semiconductor chip;
    S4: forming a plastic encapsulation layer on the surface of the first dielectric layer, wherein the plastic encapsulation layer covers the semiconductor chip's back surface and sidewalls;
    S5: removing the carrier and the adhesive layer from the surface of the first dielectric layer; and
    S6: forming a redistribution layer of the semiconductor chip on the first dielectric layer and filling the first through holes with a conductive metal.

2. The chip packaging method according to claim 1, the method further comprises step S7 of: forming an under-bump metal layer on a surface of the redistribution layer, and forming solder ball bumps on a surface of the under-bump metal layer.

3. The chip packaging method according to claim 2, wherein step S7 further comprises:
    S7-1: forming a second dielectric layer covering the redistribution layer on another surface of the first dielectric layer, and forming a plurality of second through holes in the second dielectric layer, wherein the plurality of second through holes each is aligned either with the redistribution layer or with one of the plurality of first through holes; and
    S7-2: filling the plurality of second through holes with the under-bump metal layer, aligning to the solder ball bumps, wherein the solder ball bumps are connected to the semiconductor leads through the under bump metal layer, the redistribution layer, and the conductive metal in the first through holes.

4. The chip packaging method according to claim 1, wherein, a material of the carrier is selected from at least one of a metal, a semiconductor, a polymer and glass.

5. The chip packaging method according to claim 1, wherein, a material of the adhesive layer is selected from an adhesive tape and an adhesive prepared through a spin coating process.

6. The chip packaging method according to claim 1, characterized in that, the method for removing the adhesive layer from the first dielectric layer is selected from at least one of chemical etching, mechanical peeling, mechanical grinding, thermal baking, ultraviolet irradiation, laser ablation, chemical mechanical polishing, and wet stripping.

7. The chip packaging method according to claim 1, wherein, the first dielectric layer is selected from any one of photosensitive polyimide, photosensitive benzocyclobutene and photosensitive polybenzoxazole.

8. The chip packaging method according to claim 7, wherein, in step S2, the first through holes are formed in the first dielectric layer through lithographic exposure and development.

9. The chip packaging method according to claim 1, wherein the plastic encapsulation layer is made of a thermosetting material; and wherein the method for forming the plastic encapsulation layer is selected from compressive molding, printing, transfer molding, liquid sealing molding, vacuum lamination and spin coating.

10. The chip packaging method according to claim 1, characterized in that, in step S6, the method for forming the redistribution layer includes at least one of a physical vapor deposition method, a chemical vapor deposition method, an electroplating method and a chemical plating method; wherein the redistribution layer is a single layer or multiple layers, and wherein a material of the redistribution layer is selected from at least one of aluminum, copper, tin, nickel, gold and silver.

11. A chip packaging method, comprising the following steps:
    SS1: providing a carrier, and forming an adhesive layer on a surface of the carrier;
    SS2: forming a first dielectric layer on a surface of the adhesive layer, and forming a plurality of first through holes in the first dielectric layer;
    SS3: attaching a semiconductor chip's front surface to a surface of the first dielectric layer, wherein the plurality of first through holes connects to electrical leads on the front surface of the semiconductor chip;
    SS4: forming a plastic encapsulation layer on the surface of the first dielectric layer, wherein the plastic encapsulation layer covers the semiconductor chip's back surface and sidewalls;
    SS5: removing the carrier and the adhesive layer from the surface of the first dielectric layer;
    SS6: forming a redistribution layer of the semiconductor chip on the first dielectric layer and filling the first through holes with a conductive metal;
    SS7: forming a second dielectric layer covering the redistribution layer on another surface of the first dielectric layer;
    SS8: patterning a plurality of second through holes in the second dielectric layer, wherein the plurality of second through holes each is aligned either with the redistribution layer or with one of the plurality of first through holes; and
    SS9: filling the plurality of second through holes with an under-bump metal layer; and
    SS10: forming solder ball bumps on a surface of the under-bump metal layer filled in the plurality of second through holes, wherein the solder ball bumps are connected to the semiconductor leads through the under bump metal layer, the redistribution layer, and the conductive metal in the plurality of first through holes.

12. A chip packaging method of claim 11, wherein the first dielectric layer is selected from any one of photosensitive polyimide, photosensitive benzocyclobutene and photosensitive polybenzoxazole.

\* \* \* \* \*